US006754083B1

(12) United States Patent
Lin

(10) Patent No.: US 6,754,083 B1
(45) Date of Patent: Jun. 22, 2004

(54) COMPACT FLASH CARD HAVING CONCEALED ANTENNA

(75) Inventor: Alan Lin, Hsin Chuang (TW)

(73) Assignee: Global Sun Technology Inc., Taipei (TW)

( * ) Notice: Subject to any disclaimer, the term of this patent is extended or adjusted under 35 U.S.C. 154(b) by 0 days.

(21) Appl. No.: 10/411,758

(22) Filed: Apr. 11, 2003

(51) Int. Cl.[7] .................................................. H05K 1/14

(52) U.S. Cl. ........................ 361/737; 343/702; 343/841

(58) Field of Search ................................. 361/737, 748, 361/752; 343/702, 825, 700 MS, 828, 829, 725, 729, 846, 848, 849, 876

(56) References Cited

U.S. PATENT DOCUMENTS 4,083,046 A * 4/1978 Kaloi .................. 343/700 MS
5,550,554 A * 8/1996 Erkocevic ................... 343/828
5,668,560 A * 9/1997 Evans et al. ................ 343/702
6,417,809 B1 * 7/2002 Kadambi et al. ........... 343/702
6,529,749 B1 * 3/2003 Hayes et al. ............. 455/575.7
6,570,538 B2 * 5/2003 Vaisanen et al. ............ 343/702

* cited by examiner

*Primary Examiner*—David Martin
*Assistant Examiner*—Thanh S. Phan

(57) ABSTRACT

A compact flash card device includes a board received in a housing, an L-shaped antenna member attached to the board and received in the housing, and a cover secured to the housing, to retain the antenna member and the board in the housing. Both the antenna member and the circuit board may be received and concealed within the housing such that the antenna member will not be exposed and will not increase the volume of the CF card device, and will not be stricken by the other objects, and will not be disengaged from the housing of the card device. A welding member may further solidly secure the antenna member to the board.

5 Claims, 2 Drawing Sheets

COMPACT FLASH CARD HAVING CONCEALED ANTENNA

BACKGROUND OF THE INVENTION

1. Field of the Invention

The present invention relates to a compact flash (CF) card device, and more particularly to a CF card device having a concealed antenna member.

2. Description of the Prior Art

Various kinds of typical CF card devices have been developed and provided for allowing users to communicate with various network systems, particularly the wireless network systems.

As shown in FIG. 1, illustrated is one of the typical CF card devices including a card body 7 having an antenna member 8 pivotally or rotatably attached thereto, for allowing the antenna member 8 to be rotated relative to the card body 7.

For example, as shown in solid lines in FIG. 1, the antenna member 8 may be rotated relative to or outward of the card body 7 to an outward working position, for communicating with various wireless network systems.

As shown in dotted lines in FIG. 1, the antenna member 8 may also be rotated relative to or toward the card body 7 to a storing position where the antenna member 8 is aligned with the card body 7, when the typical CF card device is not going to communicate with the network systems.

However, the antenna member 8 is extended out and exposed from the card body 7 and will be easily hit or stricken by the other objects, and will thus be easily disengaged or broken from the card body 7.

In addition, the antenna member 8 may greatly increase the volume of the typical CF card device when the antenna member 8 is extended out or rotated out from the card body 7, and exposed from the card body 7.

The present invention has arisen to mitigate and/or obviate the afore-described disadvantages of the conventional antenna members for the CF card devices.

SUMMARY OF THE INVENTION

The primary objective of the present invention is to provide a CF card device including a concealed antenna member that will not be exposed and that will not increase the volume of the CF card device, and that will not be stricken by the other objects, and that will not be disengaged from the card device.

In accordance with one aspect of the invention, there is provided a CF card device comprising a housing, a board received in the housing, an L-shaped antenna member attached to the board and received in the housing, and a cover secured to the housing, to retain the antenna member and the board in the housing. Both the antenna member and the circuit board may be received and concealed within the housing after the antenna member and the circuit board have been engaged into the housing, such that the antenna member will not be exposed from the housing, and such that the antenna member will not increase the volume of the CF card device, and such that the antenna member will not be stricken by the other objects, and such that the antenna member will not be disengaged from the housing of the card device.

The board includes a side portion having a slot formed therein, the antenna member includes a plate engaged onto the side portion of the board and a flap extended from the plate to form the L-shaped antenna member, the flap includes an edge portion engaged into the slot of the board, to secure the antenna member to the board.

A welding member may further be provided and attached between the flap and the board, to further solidly secure the flap to the board.

The board further includes a groove formed in the side portion thereof, to form and define a coupling portion between the slot and the groove thereof. The antenna member includes a finger extended from the flap, to form and define an opening between the finger and the flap, the finger is engaged into the groove of the board, and the coupling portion of the board is received in the opening of the antenna member to further secure the antenna member to the board.

Another welding member may further be provided and attached between the finger and the board, to further solidly secure the finger to the board.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
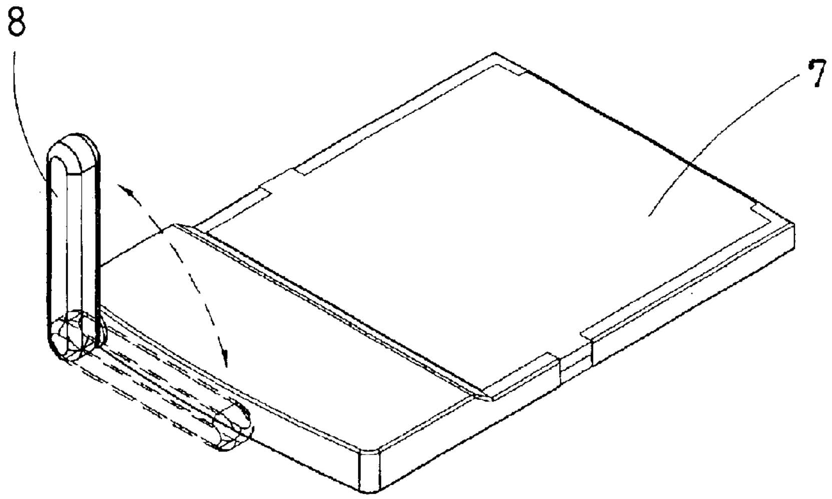
FIG. 1 PRIOR ART
FIG. 1 is a perspective view of a typical CF card device.
Figure 2:
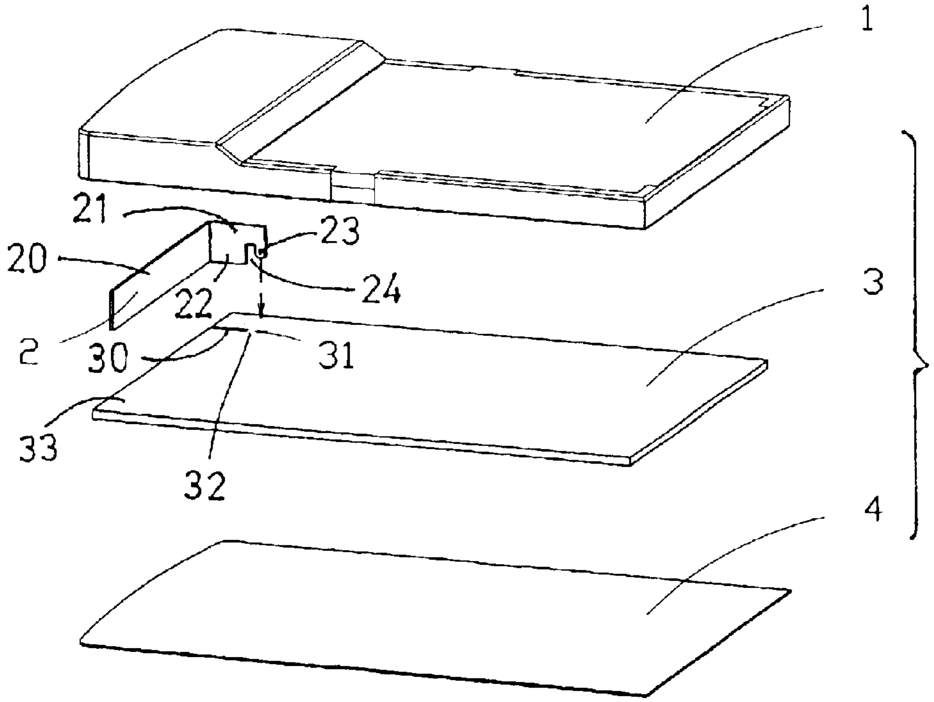
FIG. 2 is an exploded view of a CF card device in accordance with the present invention.
Figure 3:
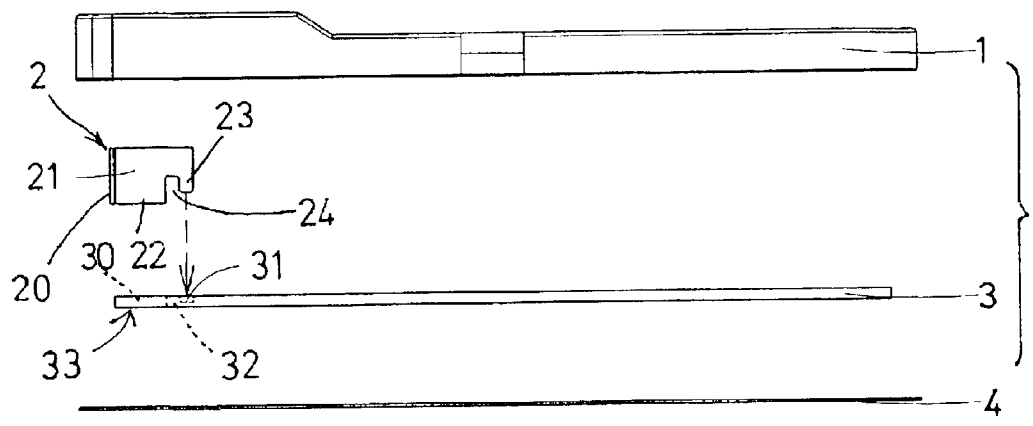
FIG. 3 is a plan and exploded view of the CF card device.

Referring to the drawings, and initially to FIGS. 2 and 3, a CF card device in accordance with the present invention comprises a housing 1, a circuit board 3 received in the housing 1 and secured to the housing 1 with such as force-fitted engagements, latches (not shown), fasteners (not shown) or the like, and a bottom board or a cover 4 attached to the bottom of the housing 1 with fasteners (not shown) or the like, to retain the circuit board 3 in the housing 1.

The circuit board 3 includes a slot 30 and a groove 31 formed in one end or one side portion, such as the front side portion 33 thereof, and a coupling portion 32 formed or defined between the slot 30 and the groove 31 thereof.

Figure 4:
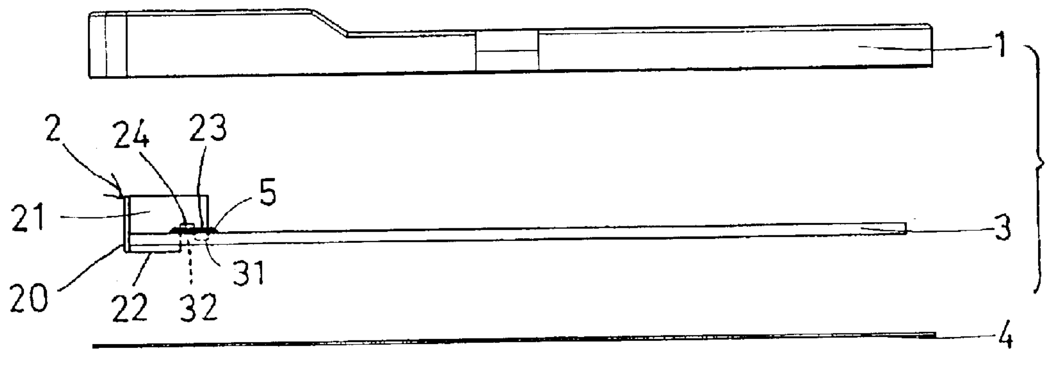
FIG. 4 is a plan and partial exploded view of the CF card device.

An antenna member 2 includes a blade 20 engaged onto or contacted with the front side portion 33 of the circuit board 30, and perpendicular to the circuit board 30, best shown in FIG. 4, and includes a flap 21 extended therefrom to form an L-shaped antenna member and having a bottom edge portion 22 engaged into the slot 30 of the circuit board 3, to secure the antenna member 2 to the circuit board 3, with such as force-fitted engagements.

The antenna member 2 may further include a finger 23 extended from the flap 21 to form or define an opening 24 therein or between the finger 23 and the flap 21. The finger 23 of the antenna member 2 may be engaged into the groove 31 of the circuit board 3, and the coupling portion 32 of the circuit board 3 may be relatively received in the opening 24 of the antenna member 2, such that the antenna member 2 may further be solidly secured to the circuit board 3, with such as force-fitted engagements.

As shown in FIG. 4, the finger 23 and/or the flap 21 of the antenna member 2 may further be solidly secured to the circuit board 3 with welding members 5, in order to further solidly secured to the circuit board 3.

Both the antenna member 2 and the circuit board 3 may be received and concealed within the housing 1 after the antenna member 2 and the circuit board 3 have been engaged into the housing 1, such that the antenna member 2 will not be exposed from the housing 1, and such that the antenna member 2 will not increase the volume of the CF card device, and such that the antenna member 2 will not be stricken by the other objects, and such that the antenna member 2 will not be disengaged from the housing 1 of the card device.

Accordingly, the CF card device in accordance with the present invention includes a concealed antenna member that will not be exposed and that will not increase the volume of the CF card device, and that will not be stricken by the other objects, and that will not be disengaged from the card device.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A CF card device comprising:

a housing, a board received in said housing, said board including a side portion having a slot formed therein, an L-shaped antenna member attached to said board and received in said housing, said antenna member including a plate engaged onto said side portion of said board and a flap extended from said plate to form said L-shaped antenna member, said flap including an edge portion engaged into said slot of said board, to secure said antenna member to said board, and a cover secured to said housing, to retain said antenna member and said board in said housing.

2. The CF card device as claimed in claim 1 further comprising a welding member attached between said flap and said board, to secure said flap to said board.

3. The CF card device as claimed in claim 1, wherein said board further includes a groove formed in said side portion thereof, to form and define a coupling portion between said slot and said groove thereof.

4. The CF card device as claimed in claim 3, wherein said antenna member includes a finger extended from said flap, to form and define an opening between said finger and said flap, said finger is engaged into said groove of said board, and said coupling portion of said board is received in said opening of said antenna member to further secure said antenna member to said board.

5. The CF card device as claimed in claim 4 further comprising a welding member attached between said finger and said board, to secure said finger and said antenna member to said board.

* * * * *